United States Patent [19]
Stark

[11] Patent Number: 5,960,307
[45] Date of Patent: Sep. 28, 1999

[54] METHOD OF FORMING BALL GRID ARRAY CONTACTS

[75] Inventor: Leslie E. Stark, Dallas, Tex.

[73] Assignee: Texas Instruments Incorporated, Dallas, Tex.

[21] Appl. No.: 08/964,727

[22] Filed: Nov. 5, 1997

Related U.S. Application Data

[60] Provisional application No. 60/031,959, Nov. 27, 1996.

[51] Int. Cl.[6] .................................................. H01L 21/44
[52] U.S. Cl. ........................... 438/612; 438/613; 438/615
[58] Field of Search ...................................... 438/584, 597, 438/66, 611, 461, 612, 613, 615, 616, 619, 760, 660, 460; 228/180.22; 257/737, 738

[56] References Cited

U.S. PATENT DOCUMENTS 5,393,696  2/1995  Koh et al. ................................ 438/613
5,516,032  5/1996  Sakemi et al. ........................... 228/246

*Primary Examiner*—John F. Niebling
*Assistant Examiner*—Christopher Lattin
*Attorney, Agent, or Firm*—Jacqueline J. Garner; Wade James Brady; Richard L. Donaldson

[57] ABSTRACT

The invention is to a method for forming solder contact balls for a ball grid array semiconductor package by aligning a sheet of solder (18) on a semiconductor package substrate (15) having a plurality of contact areas (16). A heated wire grid (20,21) is applied to the sheet of solder (18) to separate the solder sheet into a plurality of individual solder plates (22), one each for each contact area (16). Heat is then applied to the solder plates (22) and substrate (15) to melt the solder plates (22) and to reflow the melted solder to form a solder ball (23) at each contact area (16).

10 Claims, 6 Drawing Sheets

METHOD OF FORMING BALL GRID ARRAY CONTACTS

This application claims priority under 35 USC § 119(e)(1) of provisional application Ser. No. 60/031,959 filed Nov. 27, 1996.

FIELD OF THE INVENTION

This invention relates to semiconductor devices, and more particularly to a method of forming Ball Grid Array contacts on semiconductor devices.

BACKGROUND OF THE INVENTION

The density of the integrate circuits has been increasing over the past years to meet the higher performance required of the integrated circuits. Package size is getting smaller and smaller to meet the same high performance requirement resulting in higher pin density for the package. Higher pin density requires finer pitch of I/O connecting leads. Ball Grid Array packages meet the higher density pin requirements and are being used to replace current Quad Flat Package (QFP) due to the advantages of the BGA over the traditional QFP package.

BGA packages have less coplanarity problems, have self-alignment capability, and have better yield than QFP packages.

There are many kinds of ball attach technologies available, but they are all complicated in the ball attach process, and hard to get uniform balls on the substrate.

One example of ball attach is the use of a dispensing machine to dispense solder paste on the substrate directly. Since the deposited solder paste may vary in volume, each solder ball may have a different metal content. It is hard to control the solder ball height.

Another process is the attachment of preformed balls. There are two methods, one for plastic packages, and one for ceramic packages. A Eutectic solder ball is used for plastic BGA packages and a high temp solder ball is used for ceramic BGA packages.

A solder wire bond is used to form BGA balls. A wire bonder is to bond solder wire on the lead pads of substrate. The solder wire is then reflowed to melt solder into balls. This process has low productivity and low solder ball height problems.

A punch metal pellet Ball attachment process is a common method used to form the balls on a BGA package Visual inspection system must be used to ensure 100% ball placement. Since this process is covered by a patent, the process is available only under license.

Each of the above processes does not ensure uniform ball height or size, nor ensure that a ball is placed at each desired place on the semiconductor package.

SUMMARY OF THE INVENTION

The invention is to a method for forming solder contact balls for a ball grid array semiconductor package by aligning a sheet of solder on a semiconductor package substrate having a plurality of contact areas. A heated wire grid is applied to the sheet of solder to separate the solder sheet into a plurality of individual solder plates, one each for each contact area. Heat is then applied to the solder plates and substrate to melt the solder plates and to reflow the melted solder to form a solder ball at each contact area.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
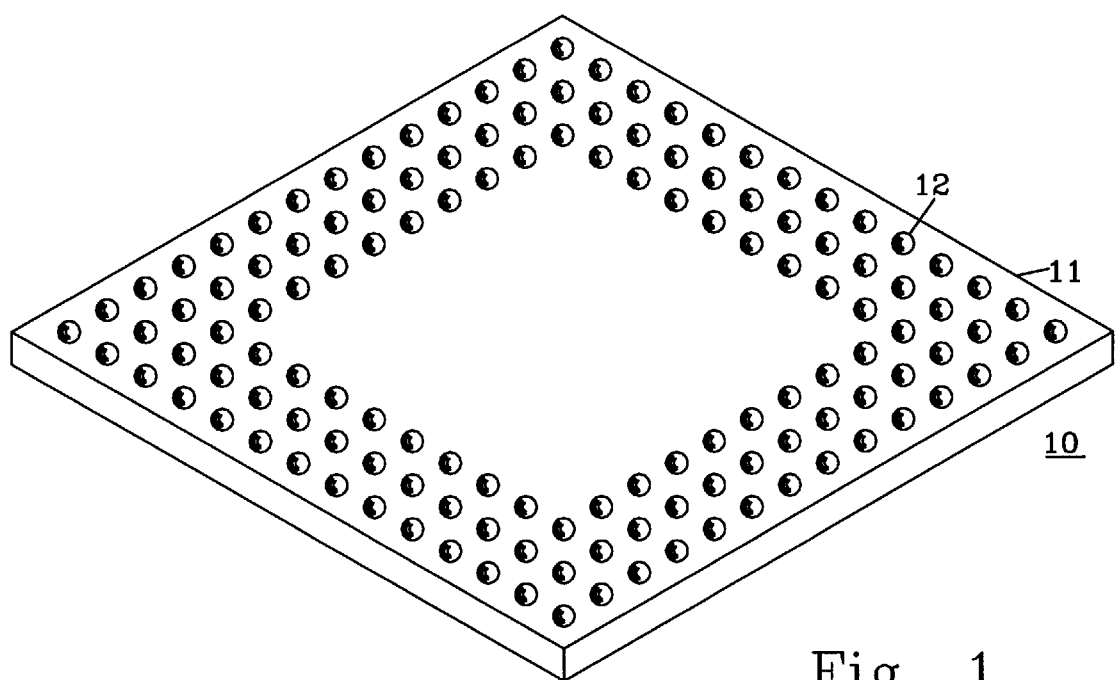
FIG. 1 shows a semiconductor package with ball grid array contacts.

FIG. 1 shows a semiconductor package 10 which includes the substrate 11 and an array of solder ball contacts 12. Each solder ball is attached to a contact point (see FIG. 2) under the solder ball. The contact point may be either a via that extends into the substrate 11 to contact an element on the semiconductor chip, or may be a conductor on the substrate that interconnects with other circuitry or a contact pad on the semiconductor package.

Figure 2:
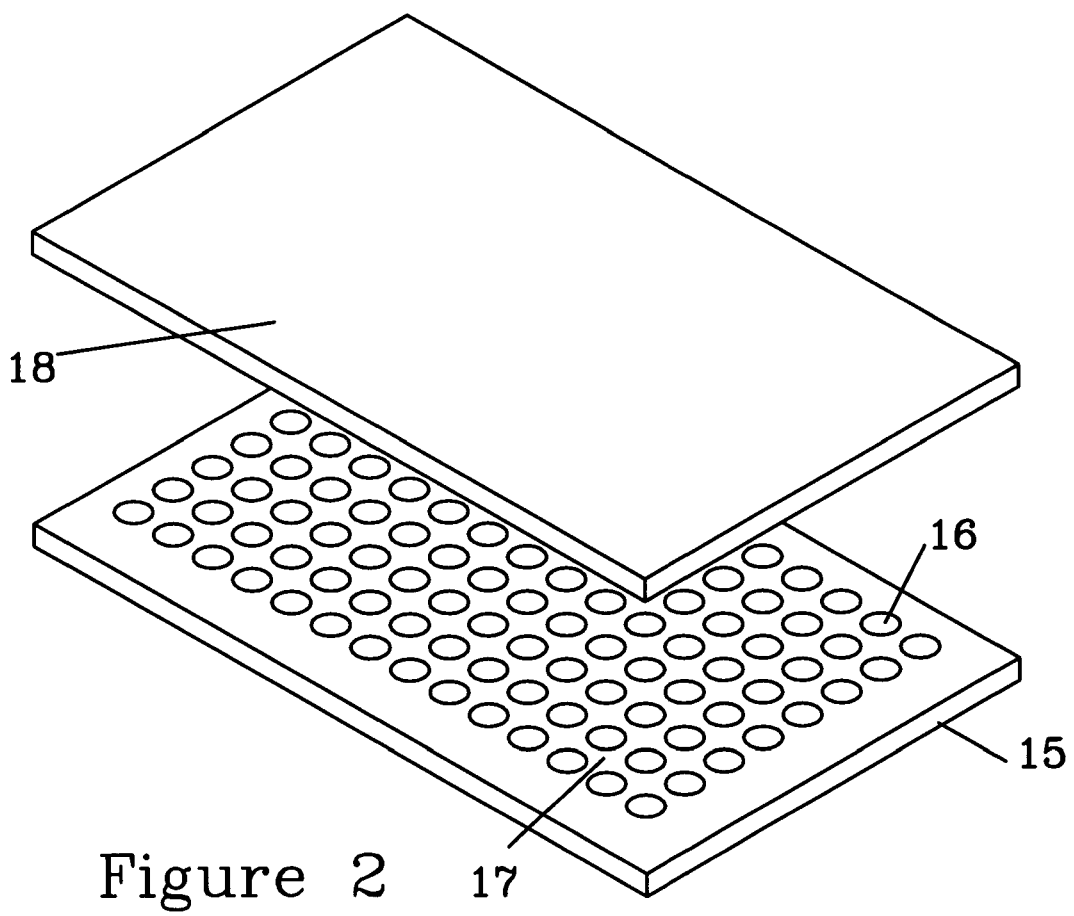
FIG. 2 shows a solder sheet positioned over a substrate.

FIG. 2 shows a semiconductor package 15 having a plurality of contact areas 16. Each contact area 16 is a place where a solder ball contact is to be placed. The area 17 in between contact areas 16 are insulated areas and are not-wetting to solder, whereas the contact areas 16 are solder wetable. Positioned above semiconductor package 15 is a sheet of solder material 18. Sheet 18 is placed on the surface of semiconductor package 15 and aligned with its edges. A solder flux may be applied to the contact areas prior to placing the solder sheet on the substrate.

Figure 3:
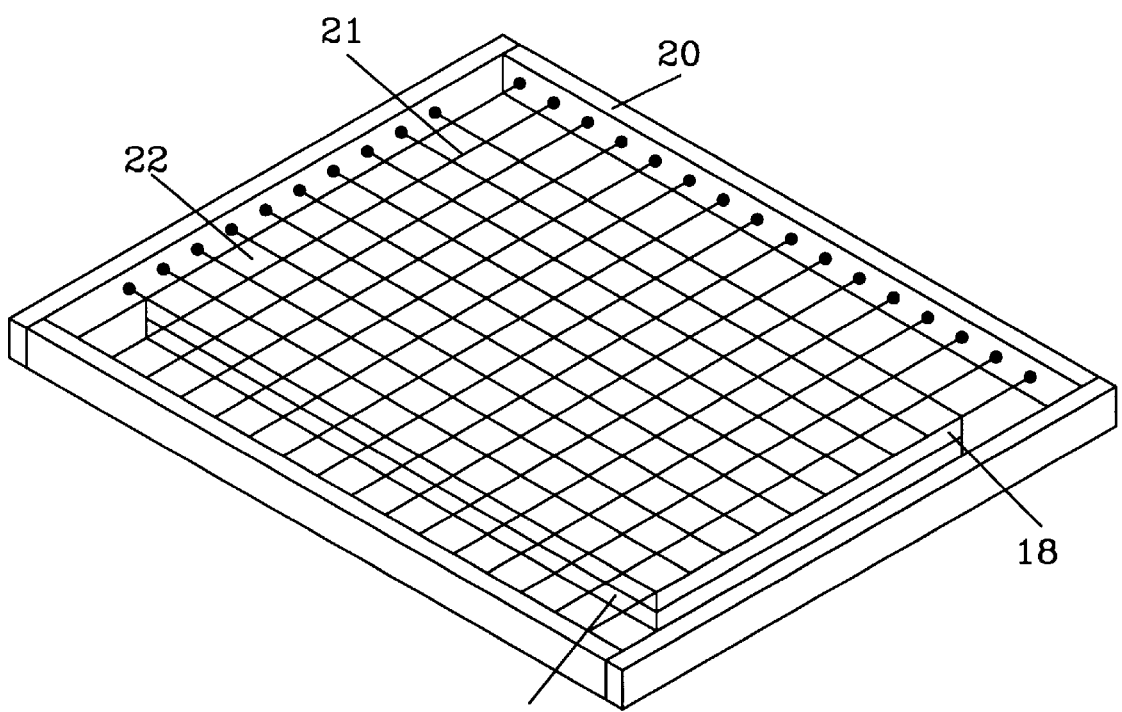
FIG. 3 shows the solder sheet on the substrate and a wire heater grid on the solder sheet.

FIG. 3 shows semiconductor package substrate 15 with the solder sheet 18 aligned on top of substrate 15. A hot mesh wire 20, of individual wires 21, of a material that will not wet solder, stainless steel for example, is placed on top of solder sheet 18 and pressed downward into the solder sheet 18 to segment the solder sheet into individual squares 22 of solder. The hot wires 21 of mesh 20 melt solder sheet 18 where the hot wires 21 come into contact with solder sheet 18 cutting through the solder sheet. The mesh wires 21 cut solder sheet 18 in to segments that are aligned over the contact areas 16, one solder square 22 for each contact area 16.

Figure 4:
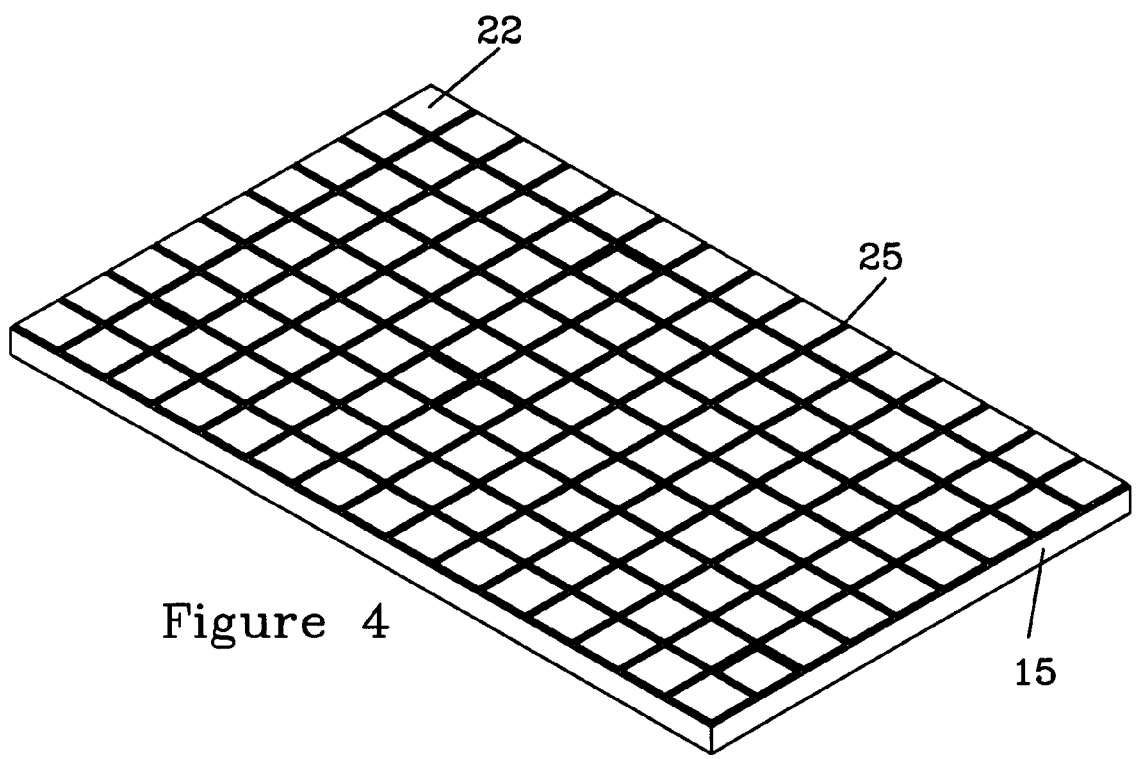
FIG. 4 shows the solder sheet segmented by the wire heater.

FIG. 4 shows substrate 15 with the individual solder squares 22 with voids 25 between each square and an adjacent square. The solder squares 22 and substrate 15 are brought to a temperature sufficient to cause the solder squares 22 to melt. The solder reflows and the surface tension of the molten solder causes the solder mass of each square 22 to form a ball separate from adjacent squares. Since on the surface of substrate 15 only the contact areas 16 are solder wetable, each solder ball will attach only to the contact area that was under a solder square 22.

Figure 5:
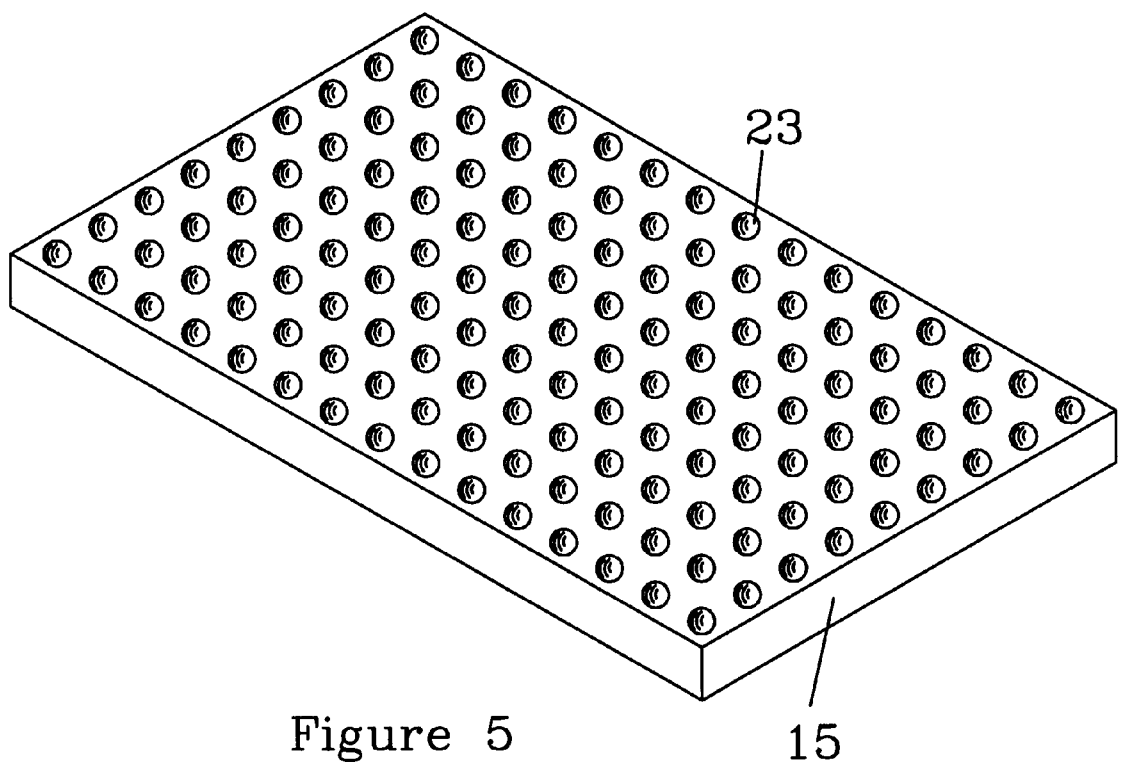
FIG. 5 shows the formed solder balls on the substrate.

FIG. 5 shows the solder balls 23 formed on and attached to a contact area 16 on substrate 15. Each solder ball size is controlled by the size of each square 22. Since each square 22 is the same as the other solder squares 22, then the size of each formed ball 23 will be the same, and since the solder ball is formed over a contact area 16, each ball is connected in a desired place. The surface 17 (FIG. 2) of the substrate 15 between contact areas 15 is non-conductive and not solder wetable. This aids in the formation of the solder balls and ensures that each solder ball 23 is electrically attached at a contact point.

Figure 6:
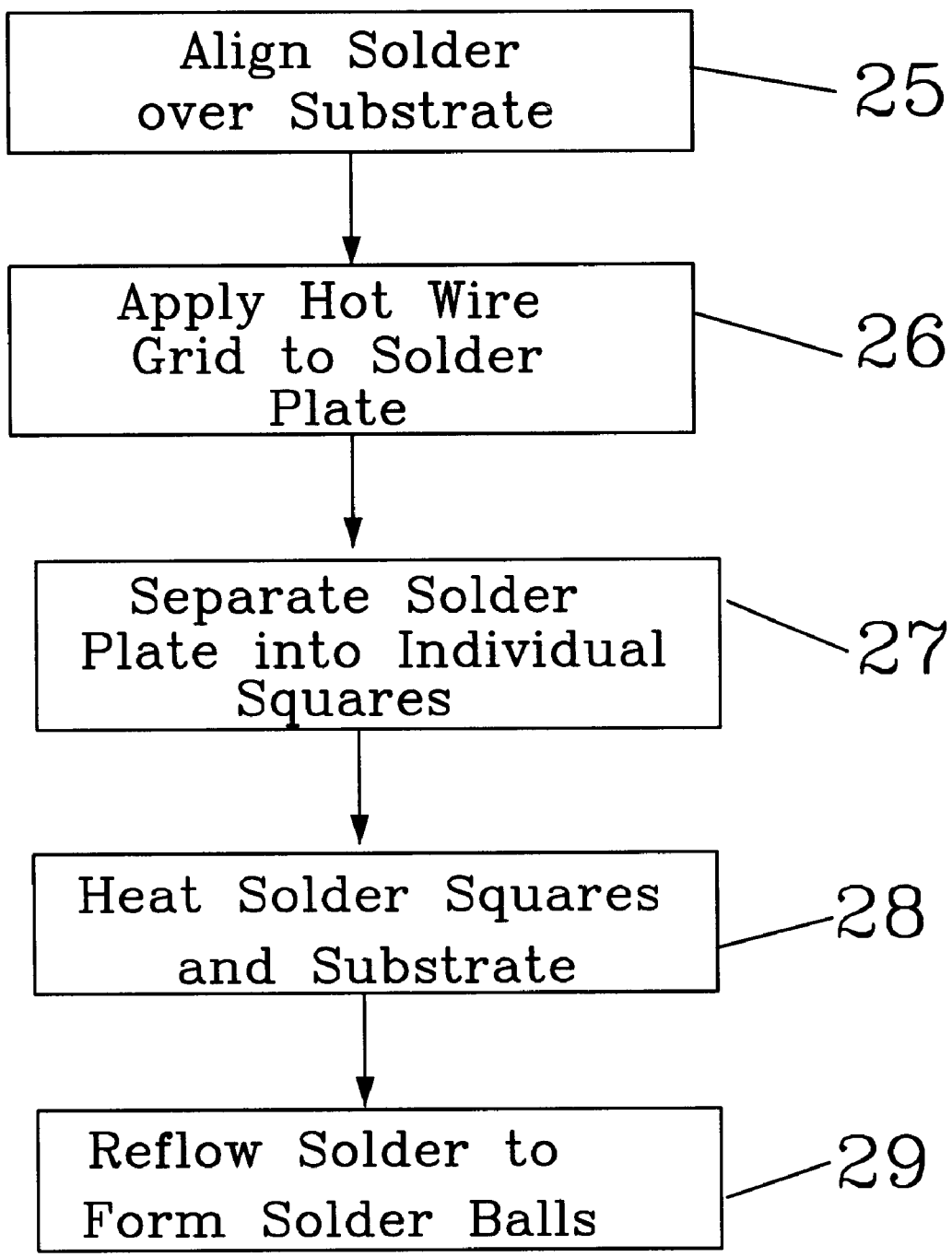
FIG. 6 is a process flow diagram for forming the solder ball contacts by solder reflow.

FIG. 6 is process flow diagram for forming the solder ball contacts by solder reflow. A solder sheet is aligned over the substrate (25). A hot wire grid is applied to the solder sheet (26). The solder sheet is cut into a plurality of solder squares such that there is one solder square over each contact area on the substrate (27). The substrate is heated (28) to cause the solder to melt and reflow forming individual solder balls (29) over each contact area. The solder balls 23 result from the surface tension of the solder which causes the solder to form a ball or sphere. Since adjacent solder squares 22 are not in contact with each other, each solder square will form a ball 23, and since an individual solder square 22 is over a wetable contact area 16, the ball 23 will form over the contact area 16 and will be attached thereto.

What is claimed:

1. A method for forming solder contact balls for a ball grid array semiconductor package, comprising the steps of:

aligning a sheet of solder on a semiconductor substrate having a plurality of contact areas;

applying a heated wire grid to the sheet of solder to separate the solder sheet into a plurality of individual solder plates, one each for each contact area;

applying heat to the individual solder plates and substrate to melt the solder plates; and reflow the melted solder to form a solder ball at each contact area.

2. The method according to claim 1, wherein the volume of each solder ball is controlled by controlling the thickness of the solder sheet.

3. The method according to claim 1, wherein all solder plates are of the same size.

4. The method according to claim 1, wherein the heated wire grid is of a material that is non-wetting to solder.

5. The method according to claim 1, wherein a solder flux is applied to the contact areas prior to aligning the solder sheet with the substrate.

6. A method for forming solder contact balls for a ball grid array semiconductor package, comprising the steps of:

aligning a sheet of solder on a semiconductor substrate having a plurality of contact areas;

applying a heated wire grid to the sheet of solder to separate the solder sheet into a plurality of individual solder plates, one solder plate aligned with each contact area;

applying heat to the individual solder plates and substrate to melt the solder plates; and reflow the melted solder to form a solder ball at each contact area.

7. The method according to claim 6, wherein the volume of each solder ball is controlled by controlling the size of the solder plates.

8. The method according to claim 6, wherein all solder plates are of the same size.

9. The method according to claim 6, wherein the heated wire grid is of a material that is non-wetting to solder.

10. The method according to claim 6, wherein a solder flux is applied to the contact areas prior to aligning the solder sheet with the substrate.

* * * * *